United States Patent [19]

Claussen

[11] Patent Number: 4,492,648
[45] Date of Patent: Jan. 8, 1985

[54] LIGHT-COLLECTING SYSTEMS USING HALOGENATED PERYLENE DERIVATIVES AS LIGHT CONVERTERS

[75] Inventor: Uwe Claussen, Leverkusen, Fed. Rep. of Germany

[73] Assignee: Bayer Aktiengesellschaft, Leverkusen, Fed. Rep. of Germany

[21] Appl. No.: 447,545

[22] Filed: Dec. 7, 1982

[30] Foreign Application Priority Data

Dec. 15, 1981 [DE] Fed. Rep. of Germany ....... 3149620

[51] Int. Cl.³ .......................... C08K 5/00; C09B 5/62; H01L 31/02; C09K 3/34; C09K 11/06; G02F 2/02; G02F 9/33
[52] U.S. Cl. ..................................... 252/582; 136/247; 252/299.1; 252/600; 252/301.35; 252/501.1; 252/301.26; 523/135; 523/137; 524/90; 546/37
[58] Field of Search ............... 546/37; 252/299.1, 600, 252/582, 301.35, 501.1, 301.26; 524/90; 136/247; 523/135, 137

[56] References Cited

U.S. PATENT DOCUMENTS

| | | | |
|---|---|---|---|
| 4,110,123 | 8/1978 | Goetzberler et al. | 136/247 |
| 4,115,386 | 9/1978 | Gall et al. | 546/37 |
| 4,230,858 | 10/1980 | Gall et al. | 546/37 |
| 4,379,934 | 4/1983 | Graser et al. | 546/37 |
| 4,404,286 | 9/1983 | Babler | 546/37 |
| 4,429,029 | 1/1984 | Hoffmann et al. | 430/37 |
| 4,431,806 | 2/1984 | Spietschka et al. | 546/37 |
| 4,446,324 | 5/1984 | Graser et al. | 546/37 |

FOREIGN PATENT DOCUMENTS

| | | | |
|---|---|---|---|
| 33079 | 5/1981 | European Pat. Off. | 546/37 |
| 47027 | 3/1982 | European Pat. Off. | 252/299.1 |
| 61092 | 9/1982 | European Pat. Off. | 252/299.1 |
| 2139690 | 2/1973 | Fed. Rep. of Germany | 546/37 |
| 2451784 | 5/1974 | Fed. Rep. of Germany | 546/37 |
| 2451782 | 5/1976 | Fed. Rep. of Germany | 546/37 |
| 2519790 | 11/1976 | Fed. Rep. of Germany | 546/37 |
| 2620115 | 11/1977 | Fed. Rep. of Germany | 136/247 |
| 2851513 | 6/1980 | Fed. Rep. of Germany | 252/255.1 |
| 3016765 | 5/1981 | Fed. Rep. of Germany | 546/37 |
| 3018006 | 11/1981 | Fed. Rep. of Germany | 546/37 |
| 44-21429 | 9/1969 | Japan | 546/37 |
| 1523475 | 8/1978 | United Kingdom . | |

*Primary Examiner*—Teddy S. Gron
*Attorney, Agent, or Firm*—Sprung Horn Kramer & Woods

[57] ABSTRACT

Light-collecting system, characterized in that it contains a dyestuff of the formula

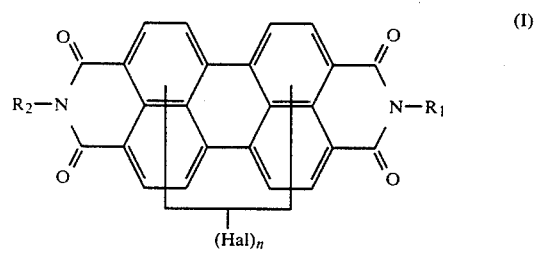

in which Hal designates identical or different halogen atoms from the series comprising fluorine, chlorine and bromine,
$R_1$ and $R_2$ designate hydrogen or optionally substituted $C_1$–$C_{18}$-alkyl and n designates 4–5, and new dyestuffs of the formula I which in a 0.5–2 mM solution in path lengths of 10 cm display an increase in transmission from 0 to >95% with a change in the wavelength of 25–120 nm.

7 Claims, No Drawings

LIGHT-COLLECTING SYSTEMS USING HALOGENATED PERYLENE DERIVATIVES AS LIGHT CONVERTERS

Devices for collecting diffuse electromagnetic radiation by utilising fluorescence are known. The key piece of collectors is a medium which is optically denser than the environment and which contains centres capable of fluorescence (German Offenlegungsschrift No. 2,620,115).

The economic feasibility of a light-collecting system is largely determined by the utilisability of the dyestuff employed within it as a light converter. Extreme demands are placed on the optical quality of this dyestuff (Festkörperprobleme XIX, 427 (1979)).

The invention relates to new light-collecting systems which are characterised in that they contain as a light converter a perylene derivative of the formula

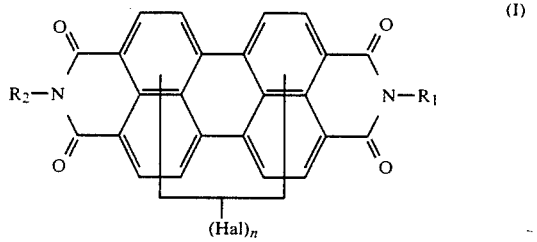

in which
Hal designates identical or different halogen atoms from the series comprising fluorine, chlorine and bromine,
$R_1$ and $R_2$ designate hydrogen or optionally substituted $C_1-C_{18}$-alkyl and
n designates 4–5.

The alkyl radicals can be substituted, for example by $C_1-C_{10}$-alkoxy, $C_1-C_{10}$-alkylthio, halogen, in particular Cl, Br or F, and cyano. Perhalogenated, in particular perfluorinated, alkyl radicals $R_1$ and $R_2$ are also of great importance. $R_1$ and $R_2$ designate in particular an optionally substituted $C_1-C_6$-alkyl radical, such as methyl, ethyl, propyl, butyl, pentyl or hexyl.

Compounds of the formulae II–III

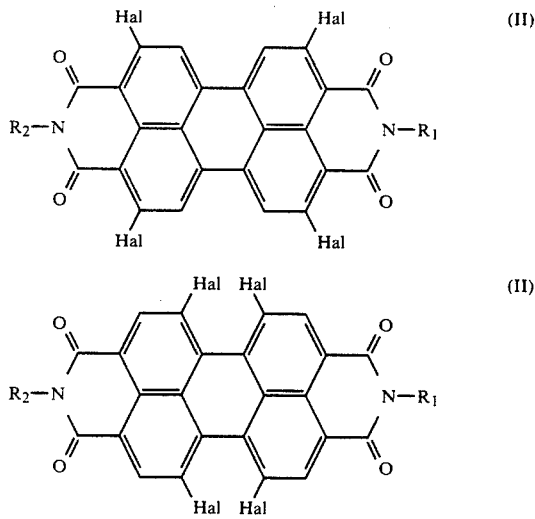

are preferably used.

In the formulae II and III, Hal, $R_1$ and $R_2$ have the meanings indicated for the formula I.

The products to be used according to the invention are known (German Patent Specification No. 394,794, German Patent Specification No. 441,587, German Offenlegungsschrift No. 2,455,782 and German Offenlegungsschrift No. 2,519,790) or can be prepared from known starting compounds analogously to methods described in the literature (see, for example, German Patent Specification No. 386,057 and German Offenlegungsschrift No. 2,455,785).

The halogenated perylene derivatives obtainable by known processes can in many cases not be used for the purpose according to the invention. The customary purification methods, such as dissolving and re-precipitating in sulphuric acid or boiling with sodium carbonate solution (see, for example, German Offenlegungsschrift No. 2,139,688), which are adequate for using the dyestuffs for mass-colouring plastics are as a rule inadequate for using the dyestuffs in light-collecting systems.

The purification necessary for this purpose is possible by absorption chromatography over silica gel. This process must be repeated several times if necessary.

To prepare relatively large amounts of the pure dyestuffs, suitable methods are, in particular, fractional crystallisation or reactive purification, preferably a combination of the two measures.

In this step, the crude product is stirred with a substance, preferably an amine, having a basic action. It is advantageous to dilute the amine with an aprotic solvent.

The amount of the amine can vary within wide limits, a starting amount of about 10% of amine, relative to the weight of product employed, having been found to be highly suitable. The reaction is carried out at room temperature to 180° C. and the concentration of the amine should be lower, the higher the temperature chosen.

Possible amines are primary, secondary or tertiary aliphatic, aromatic or heterocyclic amines.

It is advantageous to use amines which are such that they are readily removable by distillation or by washing with water. The optimally suitable amine and also the reaction conditions depend on the purification task. These values are readily determinable by manual experiments. One broadly applicable system contains methyl ethyl ketone and cyclohexylamine in a ratio of 9:1. This mixture is allowed to act for 45 minutes under reflux on the dissolved or finely suspended crude product.

The subsequent fractional crystallisation is advantageously carried out with aprotic solvents, such as DMF, DMSO, N-methylpyrrolidone, sulpholane or the like, but preferably with nitrobenzene or phenol-ethers.

The invention preferably relates to a light-collecting system which is characterised in that it contains a dyestuff of the formula I which displays in a 0.5–2 mM solution in path lengths of 10 cm an increase in transmission from 0 to 95% with a change in wavelength of 25–120 nm, preferably 35–100 nm. This optical measurement is carried out in a solvent which, within the region of measurement, is itself free of absorption and does not form coloured complexes with the dyestuff. Depending on the dyestuff, possible examples are $CHCl_3$, $CH_2Cl_2$ or dimethylformamide.

Dyestuffs having such a high purity are new. Their properties differ from those of formulations accorded the same structural formula and prepared by methods described in the literature.

Among these properties to be mentioned in particular are the surprisingly better conduction of fluorescent light and the improved light fastness in light-collecting systems according to the invention.

In many cases, in particular to improve the solubility in liquid-crystalline media, it is advisable also to employ dyestuff mixtures which contain at least one dyestuff of the formula I. Particularly favourable properties are also displayed by dyestuff mixtures of the formula I and which contain about 1 to about 20% by weight of pentahalogeno derivative and about 99 to about 80% by weight of the tetrahalogeno derivative, in particular the tetrachloro and pentachloro derivative.

The new light-collecting systems, which are systems of the dyestuffs mentioned in matrices of suitable geometry, that is optical systems in which the ratio of emission areas to absorption areas can be 1:10 to 1:1,000, are suitable for absorbing, and emitting almost without losses in a medium which is optically denser than the environment, incident diffuse electromagnetic radiation, with the main part of the emission light remaining totally reflected in the medium.

Only that fraction of the emitted light, the emission band of which is largely free of absorption, is utilisable for the purpose according to the invention.

The new light-collecting systems can be used, for example, in conjunction with photovoltaic elements for converting light energy into electric current (Festkörperprobleme XIX, 427 1979). In addition, they are also suitable for improving the brightness of electrooptical display devices (German Offenlegungsschrift No. 2,554,226) or, without electronic components, for many and varied display, indication or marking purposes, for example in passive display elements, displays, traffic signs, traffic lights, safety devices, switches or scintillators.

Light-collecting systems according to the invention contain the dyestuff dissolved in a liquid or a solid, which, according to the area in which the light-collecting system is used, can have most diverse geometrical shapes. Examples of suitable solid media, as used, for example, for collecting light in conjunction with solar cells and in passive display elements, are transparent, optically utilisable plastics, such as homopolymers and copolymers of acrylic acid or derivatives thereof, for example polymethyl methacrylate, cellulose esters, for example cellulose propionate, cellulose acetate and cellulose butyrate, polyvinyl chloride, polycarbonates, styrene-acrylonitrile polymers and polystyrene.

The light-collecting systems can moreover also contain the dyestuff dissolved in a liquid. Examples of suitable liquids are alcohols, ketones, halogenated hydrocarbons, and ethers. Specific examples are ethanol, propanol, methyl ethyl ketone, acetone, cyclohexanone, chloroform, perchloroethylene and glycol monomethyl ether.

The use, according to the invention, of dyestuffs of the formula (I) is highly advantageous, since in addition to a high quantum yield and a high amplifying factor they have excellent light fastness and hence ensure economic feasibility of the new light-collecting systems.

EXAMPLE 1

190 g of technically pure N,N'-dimethylperylene-3,4,9,10-tetracarboxylic acid diimide are dissolved in 800 g of chlorosulphonic acid and chlorinated at 25° C. in the presence of iodine by passing in 210 g of chlorine.

After the batch has been discharged onto ice, the solids are filtered off with suction and washed once with cold water, and the press cake is stirred into 1 l of water. The acid is neutralised with 10% strength sodium hydroxide solution, the mixture is adjusted to an approximately neutral pH value, and the solids are again filtered off with suction.

The operation is repeated, but this time the pH is adjusted to a value of 9.5 by means of 10% strength sodium carbonate solution. After being filtered off with suction and washed with water the residue is suspended in 1 liter of methyl ethyl ketone which contains 100 g of cyclohexylamine. The mixture is heated for 2 hours under reflux and filtered hot with suction. The residue is washed with methyl ethyl ketone and then with methanol and water. A dark brown-red product which no longer contains any N,N'-dimethylhexachloroperylene-3,4,9,10-tetracarboxylic acid diimide is obtained. Remaining pentachloro compound is removed by double crystallisation, from dimethylformamide and finally from nitrobenzene. 124 g of a dark red, shiny metallic crystalline product, which is N,N'-dimethyltetrachloroperylene-3,4,9,10-tetracarboxylic acid diimide, are obtained.

N,N'-Dimethylpentachloroperylene-3,4,9,10-tetracarboxylic acid diimide can be obtained from the mother liquors of the DMF crystallisation by further crystallisation or column chromatography.

EXAMPLE 2

5 g of N,N'-dimethylperylene-3,4,9,10-tetracarboxylic acid diimide are heated in 35 g of chlorosulphonic acid to 25° C. together with 0.5 g of iodine. 9 g of bromine are added dropwise, and the temperature is increased within 2.5 hours to 60°–70° C. This temperature is maintained for a further 2 hours, and the batch is stirred for a further 90 minutes at 80° C. A sample of the batch is then completely soluble in chloroform. The batch is then discharged onto ice and worked up. The neutral, dry reaction product is crystallised from nitrobenzene. 3 g of red crystals are obtained. These crystals represent a mixture of variously highly brominated products, of which the tetrabromo derivative forms the main part. Tetrabromo-N,N'-dimethylperylene-3,4,9,10-tetracarboxylic acid diimide can be obtained pure in the form of bright red crystals by chromatography over silica gel.

EXAMPLE 3

64 g of N,N'-dimethylperylene-3,4,9,10-tetracarboxylic acid diimide are chlorinated as in Example 1 at 40°–50° C. After the discharging onto ice and washing until neutral 80 g of crude product are obtained. The latter is dissolved in 4,600 ml of hot methoxybenzene, a small amount of filtering aid (Tonsil) is added, and the mixture is filtered hot. The red, finely crystalline precipitate is collected, washed with methoxybenzene and crystallised again from the same amount of methoxybenzene. 45 g of a brilliant red precipitate, which, according to the mass spectrum, is a mixture of tetrachloro- and pentachloro-N,N'-dimethyl-3,4,9,10-perylenetetracarboxylic acid diimide, remain after drying. The molar ratio of solvent:dyestuff is 1:1 and can be lowered to 1:2 by drying in vacuo. The chlorine content is 21.6%, which corresponds to a ratio of tetrachloro to pentachloro compound of about 9:1. This substance is significantly more soluble in organic solvents than the pure, crystallised tetrachloro compound.

In a concentration of 488.8 mg/l in methylene chloride with a path length of 10 cm, the dyestuff has a transmission of 0.05 at 562 nm and a transmission of 0.95 at 595 nm.

I claim:

1. In a light-collecting system comprising emission areas and absorption areas wherein the ratio of emission areas to absorption areas are 1:10 to 1:1,000, said light-collecting system comprising a transparent, optically usable plastic which contains centers capable of fluorescence, the improvement wherein said centers capable of fluorescence comprise a mixture of dyestuffs of the formula

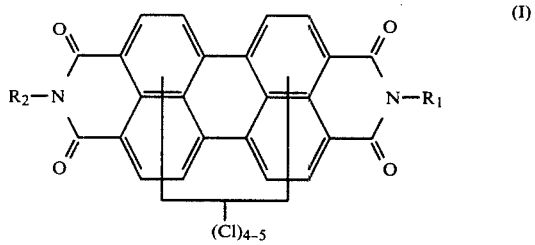

in which $R_1$ and $R_2$ designate hydrogen, unsubstituted $C_1$–$C_{18}$-alkyl radicals or $C_1$–$C_{18}$-alkyl radicals substituted by $C_1$–$C_{10}$-alkoxy, $C_1$–$C_{10}$-alkylthio, halogen or cyano, and consisting of about 1 to about 20% by weight of the pentachloro derivatives and about 99 to about 80% by weight of the tetrachloro derivatives.

2. A light-collecting system according to claim 1, wherein $R_1$ and $R_2$ designate methyl.

3. A light-collecting system according to claim 1, wherein the dyestuff mixture in 0.5-2 mM solution in path lengths of 10 cm displays an increase in transmission from 0 to 95% with a change in wavelength of 25-120 nm.

4. A light-collecting system according to claim 1, wherein the dyestuff mixture in 0.5-2 mM solution in path lengths of 10 cm displays an increase in transmission from 0 to 95% with a change of wavelength of 35-100 nm.

5. A light-collecting system according to claim 1, wherein said plastic is a homopolymer or copolymer of acrylic acid or a derivative thereof.

6. A light-collecting system according to claim 1, wherein such plastic is polymethyl methacrylate.

7. A light-collecting system according to claim 1, wherein said plastic is a polycarbonate.

* * * * *